(12) United States Patent
Jain et al.

(10) Patent No.: US 12,374,375 B2
(45) Date of Patent: Jul. 29, 2025

(54) TRACKING CIRCUITRY AND MEMORY DEVICES INCLUDING THE SAME

(71) Applicant: Taiwan Semiconductor Manufacturing Company, Ltd., Hsinchu (TW)

(72) Inventors: Sanjeev Kumar Jain, Hsinchu (TW); Atul Katoch, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 106 days.

(21) Appl. No.: 18/333,592

(22) Filed: Jun. 13, 2023

(65) Prior Publication Data

US 2024/0339141 A1    Oct. 10, 2024

Related U.S. Application Data

(60) Provisional application No. 63/494,014, filed on Apr. 4, 2023.

(51) Int. Cl.
*G11C 7/22*     (2006.01)
*G11C 7/10*     (2006.01)
(Continued)

(52) U.S. Cl.
CPC ............ *G11C 7/222* (2013.01); *G11C 7/1069* (2013.01); *G11C 7/1096* (2013.01); *G11C 7/12* (2013.01); *G11C 8/08* (2013.01)

(58) Field of Classification Search
CPC ..... G11C 7/222; G11C 7/1069; G11C 7/1096; G11C 7/12; G11C 8/08; G11C 7/227; G11C 8/18; G11C 8/14; G11C 11/419
(Continued)

(56) References Cited

U.S. PATENT DOCUMENTS 6,198,682 B1 *  3/2001  Proebsting .............. G11C 7/18
                                                 365/207
9,418,716 B1    8/2016  Palleria et al.
(Continued)

FOREIGN PATENT DOCUMENTS

KR    20150120140 A    10/2015
KR    20170137108 A    12/2017

OTHER PUBLICATIONS

Taiwan Office Action; Application No. 112129210; Dated: Jun. 18, 2024.

(Continued)

*Primary Examiner* — Huan Hoang
(74) *Attorney, Agent, or Firm* — Jones Day

(57) ABSTRACT

Devices, circuits, and methods are provided. A circuit comprises a tracking word line circuit that is configured to receive an internal clock signal, a turbo signal, and a read enable signal, and to generate a first tracking reading signal and a first tracking writing signal in response to the internal clock signal the turbo signal, and the write enable signal. The circuit also comprises a tracking bit line circuit configured to receive the first tracking reading signal and the first tracking writing signal, wherein the tracking bit line circuit is configured to generate a tracking bit line signal in response to the first tracking reading signal and the first tracking writing signal, wherein the tracking word line circuit is configured to generate a reset signal in response to the tracking bit line signal and transmit the reset signal to the clock generator.

20 Claims, 12 Drawing Sheets

(51) Int. Cl.
 *G11C 7/12* (2006.01)
 *G11C 8/08* (2006.01)
(58) Field of Classification Search
 USPC ........................................................ 365/233.1
 See application file for complete search history.

(56) References Cited

U.S. PATENT DOCUMENTS

| | | |
|---|---|---|
| 2022/0328082 A1 | 10/2022 | Cliton |
| 2022/0399052 A1 | 12/2022 | Chu et al. |
| 2023/0064595 A1 | 3/2023 | Huang et al. |

OTHER PUBLICATIONS

Korean Office Action; Application No. 1 10-2024-0044437; Dated: Dec. 2, 2024.
Korean Notice of Allowance; Application No. 10-2024-0044437; Dated: Jun. 16, 2025.

\* cited by examiner

TRACKING CIRCUITRY AND MEMORY DEVICES INCLUDING THE SAME

CROSS-REFERENCE TO RELATED APPLICATIONS

This application claims priority to U.S. Provisional Application No. 63/494,014, filed Apr. 4, 2023, entitled "Tracking Word Line Circuit for Multi-Bank SRAM Compiler," which is incorporated herein by reference in its entirety.

BACKGROUND

Timing of operations in a semiconductor memory circuit is often a factor in device performance. In certain applications seeking high reliability and flexibility, self-timing memory may be used to control the timing of operations.

BRIEF DESCRIPTION OF THE DRAWINGS

The following detailed description will be better understood when read in conjunction with the appended drawings. For the purpose of illustration, there is shown in the drawings certain embodiments of the present disclosure. It should be understood, however, that the invention is not limited to the precise arrangements and instrumentalities shown. The accompanying drawings, which are incorporated in and constitute a part of this specification, illustrate an implementation of systems and apparatuses consistent with the present invention and, together with the description, serve to explain advantages and principles consistent with the invention.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION

Figure 1:
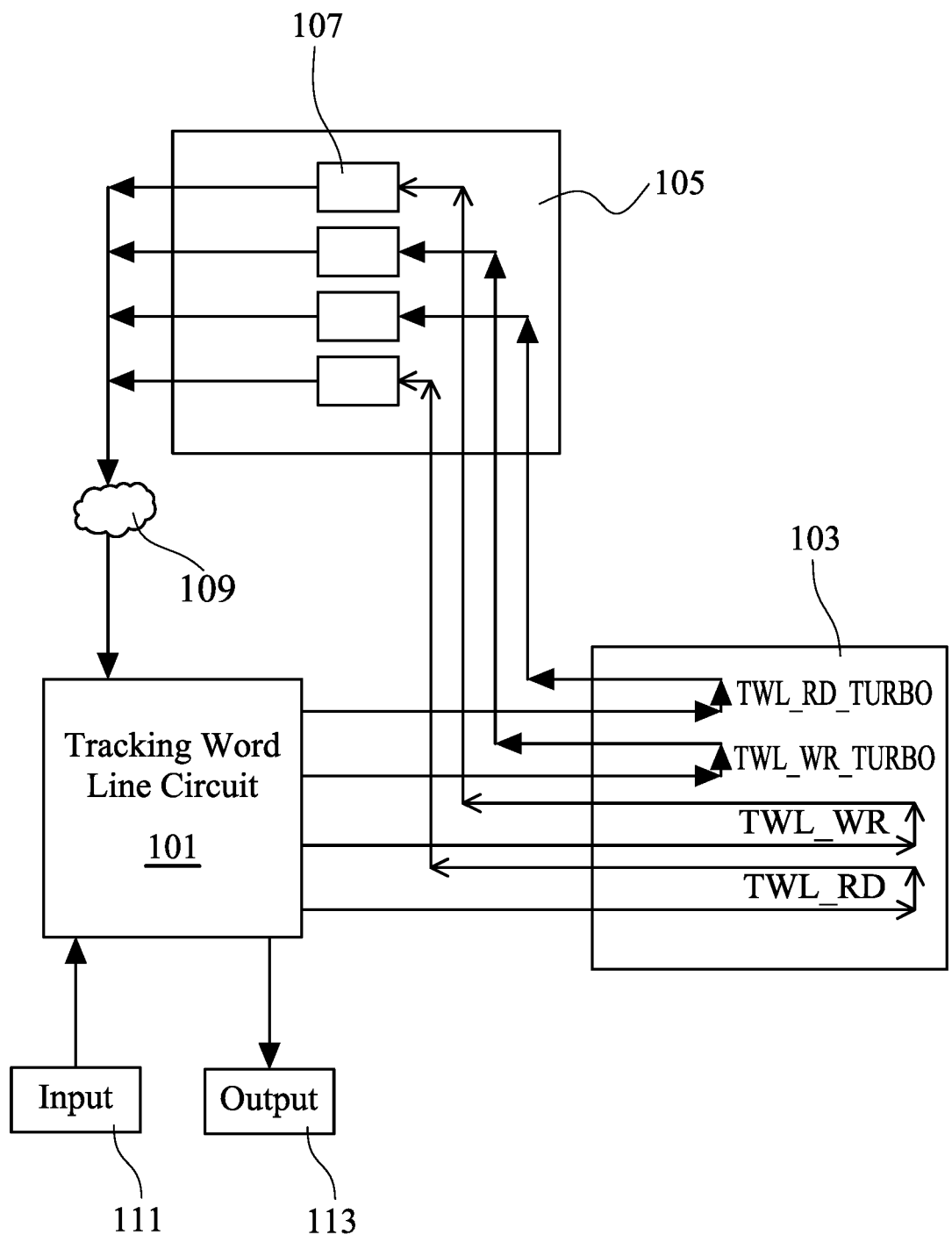
FIG. 1 is a basic circuit diagram depicting tracking circuitry according to an embodiment.

The following detailed description is provided to assist the reader in gaining a comprehensive understanding of the methods, apparatuses, and/or systems described herein. Accordingly, various changes, modifications, and equivalents of the systems, apparatuses and/or methods described herein will be suggested to those of ordinary skill in the art. Also, descriptions of well-known functions and constructions may be omitted for increased clarity and conciseness.

It is to be understood that the phraseology and terminology employed herein are for the purpose of description and should not be regarded as limiting. For example, the use of a singular term, such as, "a" is not intended as limiting of the number of items. Also the use of relational terms, such as but not limited to, "top," "bottom," "left," "right," "upper," "lower," "down," "up," "side," are used in the description for clarity and are not intended to limit the scope of the invention or the appended claims. Further, it should be understood that any one of the features can be used separately or in combination with other features. Other systems, methods, features, and advantages of the invention will be or become apparent to one with skill in the art upon examination of the detailed description. It is intended that all such additional systems, methods, features, and advantages be included within this description, be within the scope of the present invention, and be protected by the accompanying claims.

As noted above, timing of operations in a semiconductor memory circuit is often a factor in device performance. Read and write operations, the fundamental processes involved in storing and accessing data from a semiconductor memory, may take a period of time to perform. For example, a read operation may involve receiving an address corresponding to a memory cell to be read, sending a read signal to that memory cell, accessing data from the memory cell, and sending a signal containing the data to its destination. Similarly, a write operation may involve receiving an address corresponding to a memory cell, sending a write signal including data to be written on that memory cell, and encoding the cell with the data. Time elapses during all of these operations. Mistiming of signals can interrupt performance of a read or write operation, leading to failure of the operation and potentially degradation or loss of data.

In certain applications seeking high reliability and flexibility, self-timing memory may be used to control the timing of operations, rather than a central external clock. In self-timed memory structures, such as a self-timed static random-access memory (SRAM), read or write operations may be controlled by an internal clock signal. A pulse width of the internal clock signal may determine the time available for performing read and write operations. Circuits having a short internal clock signal pulse width are desirable for their high maximum frequency and fast performance, however, to avoid the errors described above, a pulse width of the internal clock signal should be sufficiently wide in order to complete read and write operations.

To ensure that the internal clock signal provides enough time to complete the desired operations, a pulse width of the internal clock signal may be set to reflect the time it takes for a read cycle or a write cycle to occur. The cycle time may be influenced by the total distance signals travel to complete a cycle, the time it takes to perform the operation on the memory cell, and various process, voltage, and temperature (PVT) variations that can affect performance. Together, these factors make up a delay through the memory circuit. Memory circuits and devices described herein may incorporate tracking circuitry that can track this delay in order to fine tune the pulse width of an internal clock signal and optimize performance.

In advanced technology, some devices may be operated at higher voltages than their nominal operating voltage. Operating in this mode may decrease read and write time such that the internal clock signal width is greater than necessary. This may lead to a cycle time that is longer than needed and impacts the maximum frequency (FMAX) of the memory. Additionally, as device sizes continue to shrink, the effects of process variation on read and write time have become more pronounced. A read data path and a write data path may exhibit different behavior due to process variation making it difficult to tune read and write margin at the same time. To combat these issues, tracking circuitry described herein may allow for fine tuning of internal clock signal pulse width at high voltages, and allow for optimization of read and write operation times independently.

In some embodiments, the memory architecture comprises a self-timed, multi-bank SRAM. In a self-timed SRAM design, memory cells may be arranged in an array, interconnected by word lines and bit lines. The time required to read data from a memory cell may depend on the time it takes for a bit line connected to the memory cell to discharge (referred to herein as the bit line discharge time). The time required to write data to a memory cell depend on the time it takes for nodes of a memory cell to flip states (referred to herein as the flip time).

To accurately track the delay for these operations, the tracking circuitry of embodiments described herein may include a tracking word line circuit and a tracking bit line circuit. The tracking circuitry may be engineered to introduce a delay that corresponds to the delay that occurs during a read or write operation. Accordingly, the internal clock signal pulse width for memory operations may be fine-tuned by controlling a corresponding delay in the tracking circuitry.

FIG. 1 is a basic circuit diagram depicting tracking circuitry in accordance with an embodiment. The tracking circuitry may comprise a tracking word line circuit 101, a tracking bit line circuit 105, and combinational logic 109. In an embodiment, the tracking word line circuit may include tracking word line loops 103 that have a predetermined length in order to introduce a delay of a desired period. The tracking bit line circuit 105 may comprise a plurality of tracking memory cells 107 that are configured to imitate the response of memory cells of a memory array. Tracking memory cells 107 may comprise 6T cells, 8T cells, 10T cells, or any other type of suitable memory cells selected so as to introduce a delay that corresponds to a delay across memory cells of the memory array being tracked. Combinational logic 109 may be designed to introduce a specific delay to the signal path, however, in some embodiments this delay may not be necessary and combinational logic 109 may be omitted.

In operation, the tracking word line circuit 101 may receive a plurality of input signals 111, including an internal clock signal. Based on these signals, the tracking word line circuit 101 generates a particular tracking signal. For example, if the device is being operated at high voltage (also referred to as operating in turbo mode), the tracking word line circuit 101 may generate a corresponding turbo signal. If the memory is in turbo mode and performing a read operation, the tracking word line circuit 101 may generate a turbo mode tracking reading signal TWL_RD_TURBO. If the memory is in turbo mode and performing a write operation, the tracking word line circuit 101 may generate a turbo mode tracking writing signal TWL_WR_TURBO. If, however, the memory is operating under nominal voltage conditions, performing a read operation may cause the tracking word line circuit 101 to output a nominal tracking reading signal TWL_RD, and performing a write operation may cause the tracking word line circuit 101 to output a nominal tracking writing signal TWL_WR.

The tracking signals may be routed through tracking word line loops 103 to introduce a delay of desired amount of time. Each tracking signal traverses a corresponding tracking word line loop comprising a corresponding word line of a particular length. For example, TWL_RD may travel along a tracking read word line that has a length designed to correspond to the time of a read operation under nominal voltage. TWL_WR may travel along a tracking write word line that has a length designed to correspond to the time of a write operation under nominal voltage. TWL_RD_TURBO may travel along a turbo tracking read line that has a length designed to correspond to the time of a read operation in turbo mode, and TWL_WR_TURBO may travel along a turbo tracking write line that has a length designed to correspond to the time of a write operation in turbo mode.

In an embodiment, operating in turbo mode may cause read and write operations to speed up. The read operation may depend on a bit line discharge time, and the write operation may depend on the flip time of memory cells of the memory blocks. Bit line discharge and flip time may be faster at the high voltages of turbo mode. As such, the tracking word line loops for turbo mode tracking signals TWL_RD_TURBO and TWL_WR_TURBO may be shorter than those of nominal tracking signals TWL_RD and TWL_WR.

After traversing a tracking word line loop, the generated signals may be routed to the tracking bit line circuit 105 where they pass through tracking memory cells 107. As will be described in greater detail below with respect to FIG. 2, the particular connections through tracking memory cells 107 may be selected so as to introduce a delay that corresponds to the delay across a weakest memory cell of the memory. The tracking signals may discharge bit lines of the cells 107, thereby generating a reset signal that may be routed through combinational logic 109 and return to the tracking word line circuit 101. This reset signal may be output at output terminal 113 and used to reset a clock generation circuit.

Figure 2:
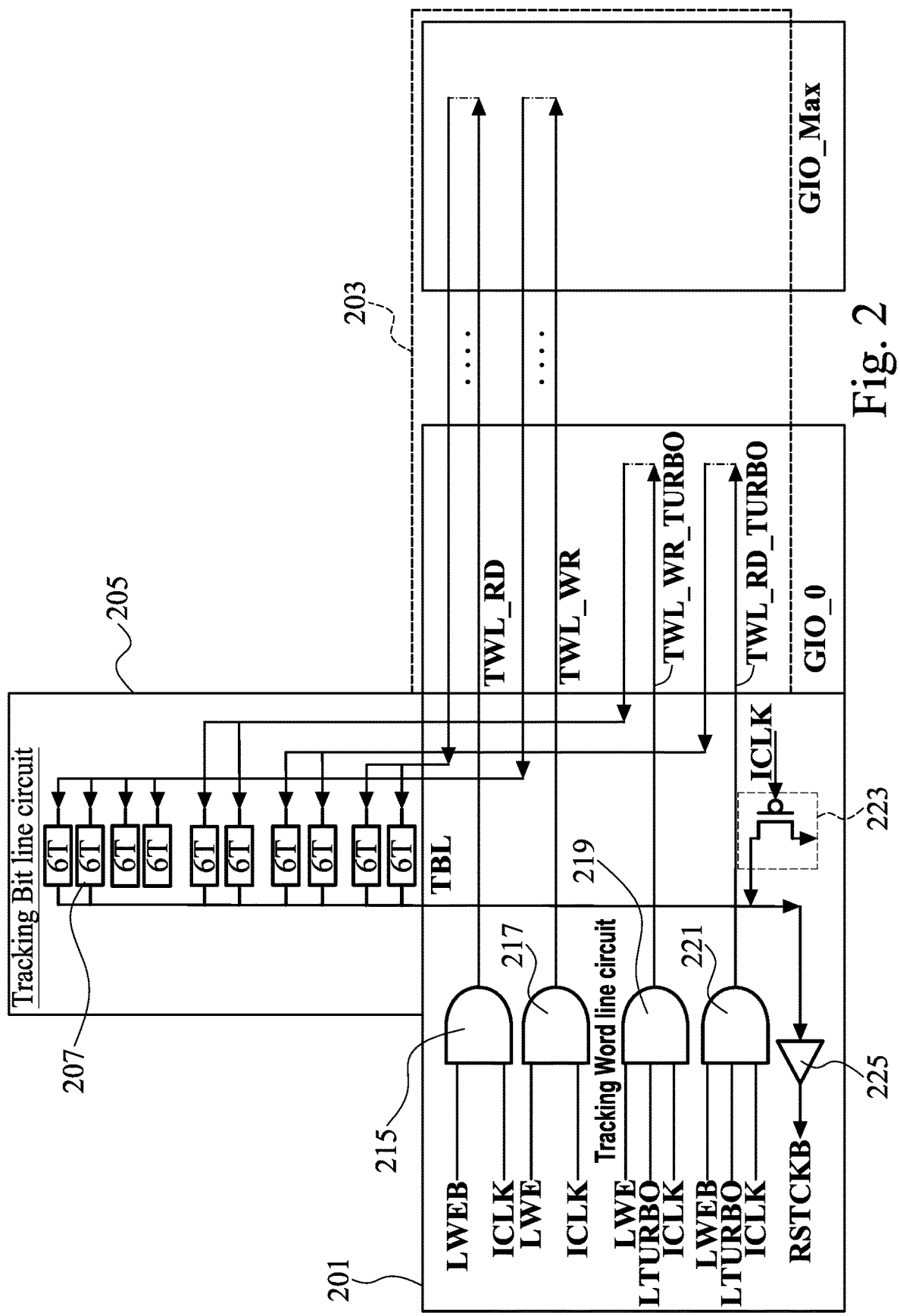
FIG. 2 is a detailed circuit diagram depicting tracking circuitry according to an embodiment.

FIG. 2 is a detailed circuit diagram depicting tracking circuitry according to an embodiment. The circuit of FIG. 2 may include the same or similar components as that described above with respect to FIG. 1. For example, tracking circuitry may comprise a tracking word line circuit 201 and a tracking bit line circuit 205. The tracking word line circuit 201 may include tracking word line loops 203 that introduce a delay for a signal generated by the tracking word line circuit 201. The tracking bit line circuit 205 may comprise a plurality of tracking memory cells 207. The tracking memory cells 207 may simulate the actual operating time of cells in memory banks of an associated memory. In FIG. 2, the tracking memory cells 207 are depicted as 6T cells, however, these cells may also be 8T cells, 10T cells, or any other type of suitable memory cells depending on the design requirements. The signals generated by the tracking word line circuit 201 may discharge bit lines of the tracking memory cells 207.

In an embodiment, tracking word line circuit 201 may comprise a plurality of logic gates 215/217/219/221. Each logic gate may have a plurality of inputs and may output a tracking signal based on these inputs. For example, input signals for the tracking word line circuit may comprise an internal clock signal ICLK, a write enable signal LWE, a read enable signal LWEB, and a turbo signal LTURBO. Internal clock signal ICLK is generated by a clock generation signal and begins a read or write operation. The other signals may be on or off based on operating conditions of the signal. The write enable signal LWE may be on during a write operation and off during other operations. The read enable signal LWEB may be on during a read operation and off during other operations. The turbo signal LTURBO may be on when the device during high voltage operation (turbo mode) and off during nominal voltage operation. The logic gates of the tracking word line circuit generate and output tracking signals based on the states of these inputs.

A first logic gate 215 may be an AND gate that takes LWEB as a first input and ICLK as a second input. During a read operation, the read enable signal LWEB may be on, causing first logic gate 215 to output tracking reading line signal TWL_RD when ICLK is generated. A second logic gate 217 may be an AND gate that takes LWE as a first input and ICLK as a second input. During a write operation, the write enable signal LWE may be on, causing second logic gate 217 to output tracking writing line TWL_WR when ICLK is generated. TWL_RD and TWL_WR may travel along respective tracking word line loops 203, and the length of these loops may be set to introduce a desired delay.

In an embodiment, tracking word line loops 203 are located in a global input/output (GIO) circuit of a memory macro. The nominal voltage tracking signals may traverse through the entirety of the GIO region from a first region GIO_0 immediately adjacent to the tracking word line circuit 201 through a final region GIO_Max. The length of this loop is calculated such that the time it takes for the signals TWL_RD and TWL_WR to traverse the loop corresponds to the time it takes to perform a read operation and write operation, respectively, on a weakest memory cell of the memory banks of the macro.

First and second logic gates 215 and 217 generate nominal tracking signals independent of the presence of the turbo signal LTURBO. As such, regardless of whether the devices is operating in turbo mode or under nominal voltage, first logic gate 215 will output TWL_RD when LWEB is active and second logic gate 217 will output TWL_WR when LWE is active. Third logic gate 219 and fourth logic gate 221, however, only output tracking signals during turbo mode operation.

Third logic gate 219 may be an AND gate having three inputs. The third logic gate may take LWE as a first input, LTURBO as a second input, and ICLK as the third input. When the device is being operated at high voltage, LTURBO is active. During a write operation in turbo mode, LWE is also on, and the third logic gate 219 may output a turbo mode tracking writing signal TWL_WR_TURBO when ICLK is generated. Fourth logic gate 221 may also be an AND gate having three inputs. The fourth logic gate 221 may take LWEB as a first input, LTURBO as a second input, and ICLK as the third input. During a read operation in turbo mode, LWEB is on, and the third logic gate 221 may output a turbo mode tracking reading signal TWL_RD_TURBO when ICLK is generated. TWL_WR_TURBO and TWL_RD_TURBO may travel along respective tracking word line loops 203. The lengths of the tracking word loops for turbo signals may be smaller than those of the nominal tracking signals in order to introduce a smaller delay.

In an embodiment, the turbo tracking signals may also travel through the GIO region of the memory macro. Unlike the nominal tracking signals, however, the turbo tracking signals do not travel all of the way through the GIO region. The shorter signal paths introduce a smaller delay in order to correspond to the quicker read and write operations occurring under turbo mode. In nominal voltage operation (LTURBO=0) only TWL_RD is used during a read operation and only TWL_WR is used during a write operation. In high voltage operation (LTURBO=1), however, both TWL RD and TWL_RD_TURBO are used during a read operation and both TWL_WR and TWL_WR_TURBO are used during a write operation.

The tracking bit line circuit 205 may receive the tracking signals after they traverse tracking word line loops 203. The tracking signals may discharge bit lines of tracking memory cells 207 within the tracking bit line circuit 205, thereby generating a tracking bit line signal TBL that is output from the tracking bit line circuit 205.

The tracking bit line signal may be used to generate a reset signal RSTCKB that resets the operation to begin a next clock cycle. The TBL signal may be translated into a reset signal via elements 223 and 225. The elements 223 and 225 may comprise transistors or groups of transistors interconnected to form logic gates. For example, element 223 may be a PMOS transistor that has a gate connected to the internal clock signal ICLK. Element 225 may be a logic element that outputs the reset signal RSTCKB. This signal may be output to a clock generation circuit to start a next clock cycle. The RSTCKB signal triggers the end of the internal clock signal. As such, the pulse width of the internal clock signal may depend on the time elapsed between generation of the tracking signals and generation of the reset signal. By controlling the length of tracking word line loops 203, a designer may be able more precisely tune the ICLK pulse width. In this way, the pulse width of ICLK may be a function of the delay introduced by a tracking word line loop.

In an embodiment, each tracking signal may be routed through more than one tracking memory cell 207. The number of tracking memory cells connected to each tracking signal may be a function of the read or write operation time of a weakest memory cell. For example, the number of tracking memory cells connected to TWL_RD may be a function of the bit line discharge time of a weakest memory cell, and the number of tracking memory cells connected to TWL_WR may be a function of the flip time of a weakest memory cell. Connecting a signal to more cells speeds up the discharge process. The connection scheme between tracking signals and tracking memory cells are described in more detail below, with respect to an example memory circuit.

A bit line discharge time of the weakest cell (in read operation) may be 300 picoseconds (ps), a flip time of the weakest cell (in write operation) may be 150 picoseconds, and an example tracking memory cell 207 may provide a delay of 600ps. As such, to simulate a read process through the weakest cell, TWL_RD may be connected to two tracking cells, and to simulate a write process through the weakest cell, TWL_WR may be connected to four tracking cells.

In turbo mode, the operations across the weakest memory cells occur at a faster pace. By including the turbo signals TWL_WR_TURBO and TWL_RD_TURBO along with the nominal signals, additional tracking cells are discharged during a write operation or a read operation thereby shortening the path time. For example, TWL_WR_TURBO and TWO_RD_TURBO may each be connected to two tracking cells. Accordingly, a read operation may discharge four tracking cells, two via TWL_RD_TURBO and two via TWL RD. A write operation may discharge four tracking cells, two via TWL_WR and two via TWL_WR_TURBO.

In the example circuit, a nominal operating voltage may be 0.6V. In operation at a nominal voltage, an ICLK pulse for a read cycle may have a pulse width matching the bit line discharge time of the weakest memory cell of 300ps as described above. The locations and lengths of TWL_RD and TWL_WR are fixed so as to provide a corresponding delay in the tracking circuitry. In turbo mode, however, the operation may only take 200ps. Without separate tracking lines for turbo signals, time through the tracking circuitry may be 250ps, leading to an inefficiency of 50ps. To compensate for this 50ps difference, the turbo tracking word lines are introduced. The length of and location of these word lines may be set during circuit design so as to precisely tune the ICLK pulse width in turbo mode and eliminate any inefficiency.

The number of tracking memory cells in a tracking bit line circuit 205 may be selected based on read and write margin tuning that occurs during design in a memory compiler. The locations of the four tracking word lines can be chosen anywhere within the tracking bit line circuit. This may provide additional flexibility to tune the read and write margins independent of one another. As described further below with respect to FIG. 7A, a memory compiler is a software tool that creates circuit layouts from a designer's input specifications. The memory compiler may be capable of setting the length of the tracking word line loops and the number of tracking cells connected to each tracking word line in a specific configuration to precisely match the bit line discharge time of the weakest memory cell in a read operation and the flip time of the weakest memory cell of write operation. In some embodiments, the tracking circuitry is designed to be implemented in an SRAM macro through an SRAM compiler.

Figure 3:
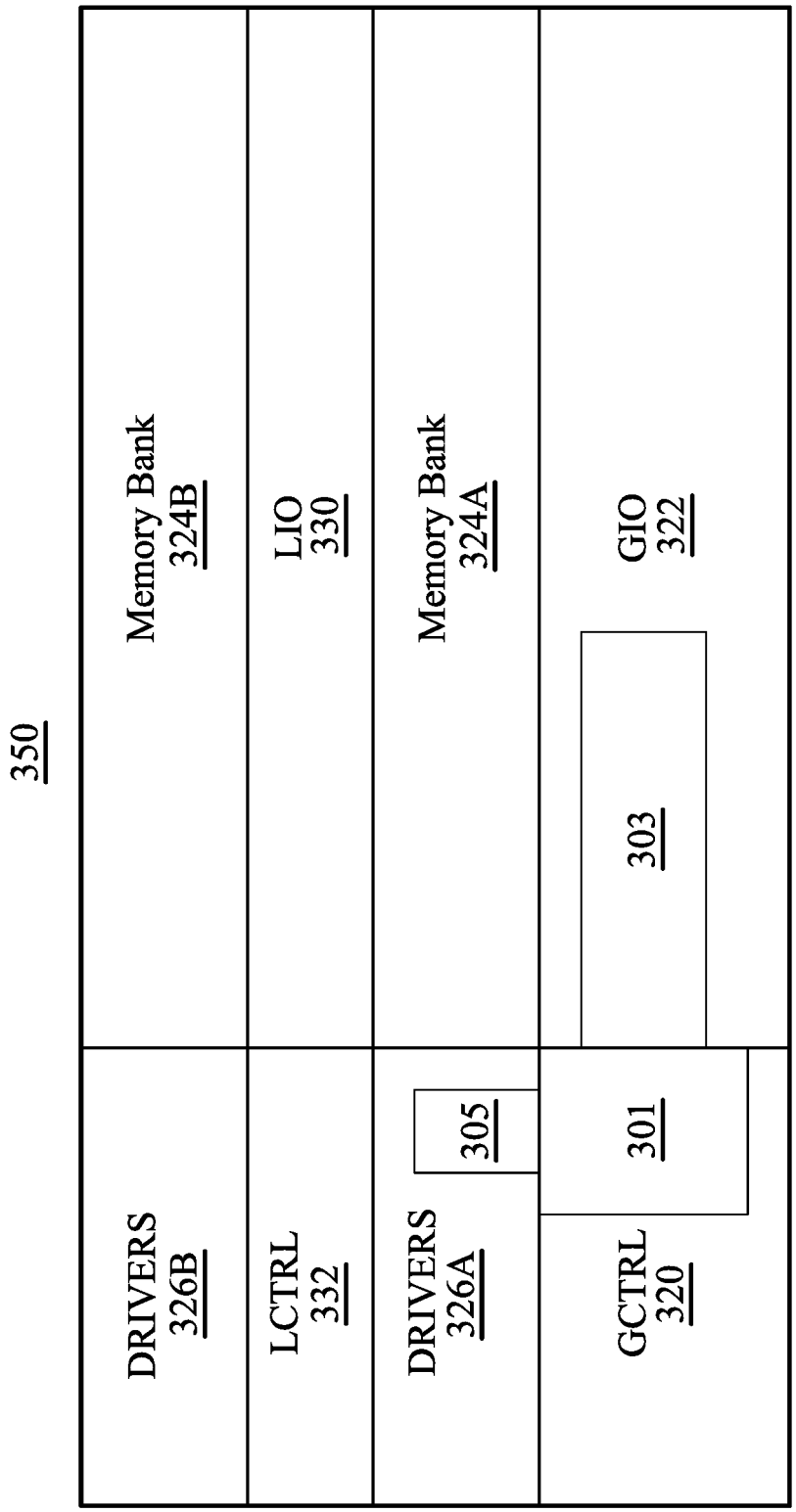
FIG. 3 is a schematic diagram depicting a memory macro according to an embodiment.

FIG. 3 is a schematic diagram depicting a memory macro according to an embodiment. Memory macro 350 may be an SRAM macro. An example SRAM memory device may comprise a plurality of SRAM macros, and each macro may comprise a plurality of memory banks 324A and 324B. Each memory bank of an example SRAM may comprise a plurality of memory cells arranged in rows and columns. In an embodiment, an SRAM may include a bottom memory bank 324A and a top memory bank 324B separated by a local input/output (LIO) region 330 that is configured to route signal through the SRAM. Memory cells of each memory bank 324A/324B may be driven by corresponding drivers 326A/326B located in control regions adjacent to the memory banks. LIO region 330 may be adjacent to a local control (LCTRL) region 332 that houses additional control components for the memory.

In an embodiment, SRAM macro 350 may comprise tracking circuitry as described above with respect to FIGS. 1 and 2. For example, the SRAM may comprise a tracking word line circuit 301 located within global control (GCTRL) region 320 of the architecture. The tracking circuitry may further comprise tracking word lines loops 303 that extend into a global input/output (GIO) region 322 of the architecture, and a tracking bit line circuit 305 extending into another region of the architecture. The tracking bit line circuit 305 may extend into a first control region that houses drivers 326A.

The tracking circuitry of the SRAM is designed to simulate the timing of read and write operations through memory cells of the memory banks of the SRAM. During operation, an internal clock signal may be generated in GCTRL region 320 in order to begin an operation on the memory banks 324A/324B. This signal is also fed as an input into the tracking word line circuit 301 and starts the process of generating tracking signals. A more detailed description of signal propagation through the SRAM is described below with respect to FIG. 4.

Figure 4:
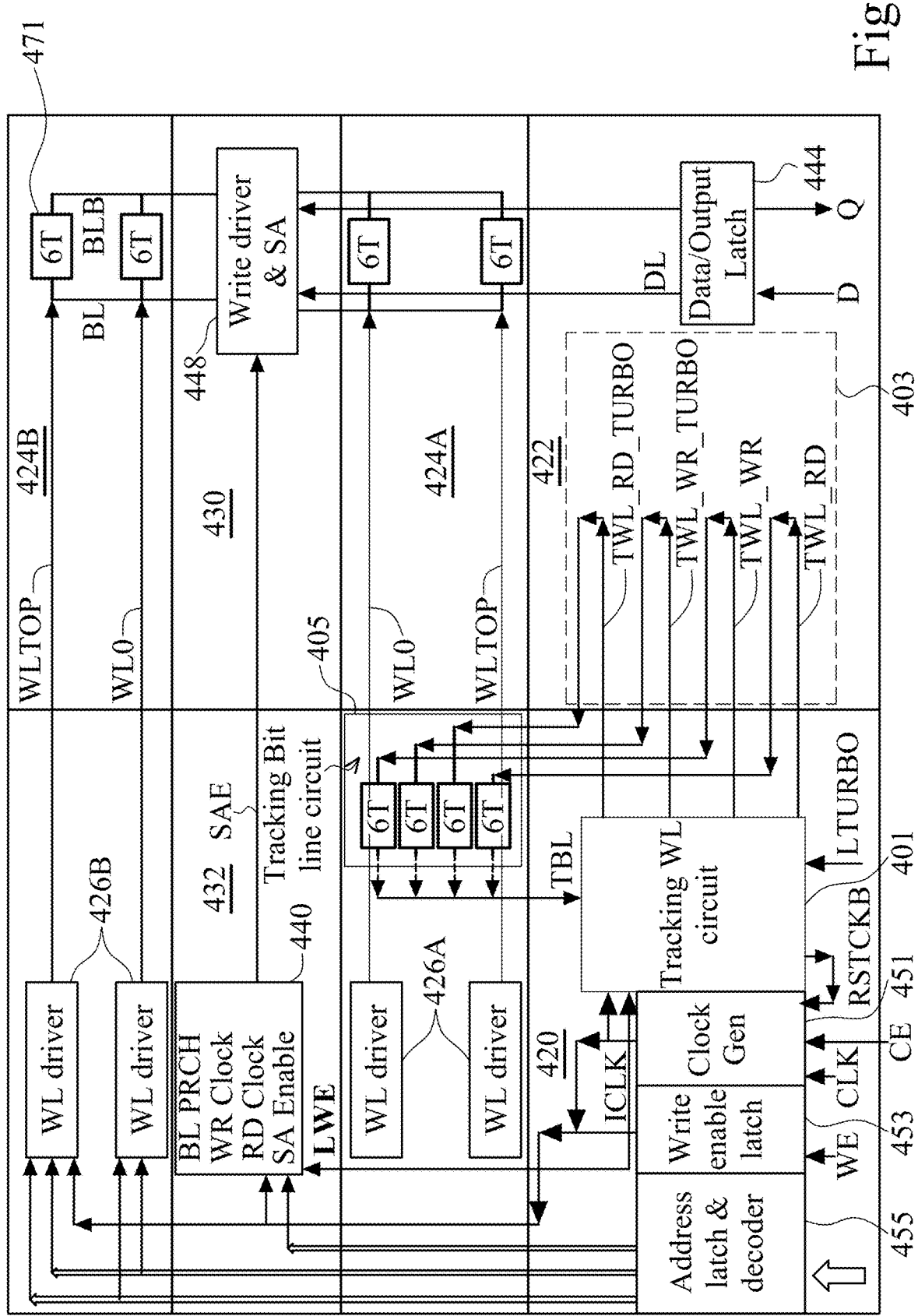
FIG. 4 is a block diagram depicting a memory device and circuit according to an embodiment.

FIG. 4 is a block diagram depicting a memory device and circuit according to an embodiment. The memory device may comprise a tracking word line circuit 401 disposed in a global control region 420 of the memory_device. The global control region 420 may further comprise a clock generator 451, a write enable latch 453, and an address latch and decoder 455. The clock generator 451 may be configured to receive an external clock signal CLK and generate an internal clock signal ICLK in response. The internal clock signal may trigger a write operation or a read operation for the memory, as well as a corresponding tracking event through the tracking circuitry.

Write enable latch 453 may receive instructions to perform an operation from an external signal WE. The write enable latch 453 may be configured to generate write enable signal LWE from external signal WE. Write enable signal LWE may initiate a write operation on the memory device, and may generate tracking writing signals along the tracking circuitry. The write enable latch 453 may further comprise logic gates including an inverter that transforms write enable signal LWE into read enable signal LWEB that initiates a read operation on the memory device, and generates tracking reading signals along the tracking circuitry. The tracking circuitry may include tracking word line loops 403 that extend into GIO region 422.

The address latch and decoder 455 may comprise both an address latch configured to store input addresses and a decoder configured to select specific memory cells based on the input addresses. When a read or write operation is initiated for the memory device, address latch and decoder 455 may route signals through the memory to perform these operations on the memory cells within banks 424A/424B.

A first memory bank 424A may be located in a first region adjacent to GIO region 422. The first memory bank 424A may comprise a plurality of memory cells 471. In the embodiment shown in FIG. 4, memory cells 471 may comprise 6T cells, however, in other embodiments memory cells may be 8T cells, 10T cells, or any other type of suitable memory cell. The memory cells may receive signals from word line drivers 426A located in a region adjacent to the memory bank region 424A. Word line drivers 426A may receive signals from components in the GCTRL region in order to initiate read and write operations on the memory cells in memory bank 424A. Each memory bank may have a plurality of word lines connected to a plurality of word line drivers. Word lines may be numbered from a first word line of a bank WL0 to a last word line of a bank WLTOP.

The circuit may further comprise a LIO region 430 adjacent to the first memory bank 424A. LIO region 430 may comprise LIO circuitry 448. This circuitry may include a write driver circuit and a sense amplifier (SA). The write driver circuit may be used in conjunction with word line drivers of the circuit to write data into memory cells 471. The write driver circuit may receive an input data signal D from a data/output latch 444. The data signal D may be sent along a data line DL from the latch 444 to the write driver circuit. The sense amplifier may be used to amplify and detect signals during a read operation. For example, a Q signal, representing a stored data value, may be amplified by the sense amplifier and passed along to the data/output latch 444. The latch may hold this output value stable until a next clock cycle.

The circuit may further comprise a LCTRL region 432 adjacent to the LIO region 430. LCTRL region 432 may comprise LCTRL circuitry 440 in communication with LIO circuitry 448. LCTRL circuitry 440 may comprise a bit line pre-charge signal generator (BL PRCH), a write clock signal generator (WR Clock), read clock signal generator (RD Clock), and a sense amplifier enabling circuit (SA Enable). Components of LCTRL circuitry 440 may pass specific signals to LIO circuitry 448 in order to perform read and write operations. For example, the sense amplifier enabling circuit may pass a sense amplifier enable signal (SAE) to the sense amplifier of LIO circuitry 448.

A second memory bank 424B may be disposed adjacent to the LIO region 430. The second memory bank 424B may comprise a second plurality of memory cells 471 connected to a second plurality of word lines. The second plurality of memory cells 471 may be connected to a second plurality of word line drivers 426B via the second plurality of word lines. The second plurality of word line drivers 426B may be located in a region adjacent to LCTRL region 432.

Figure 5A:
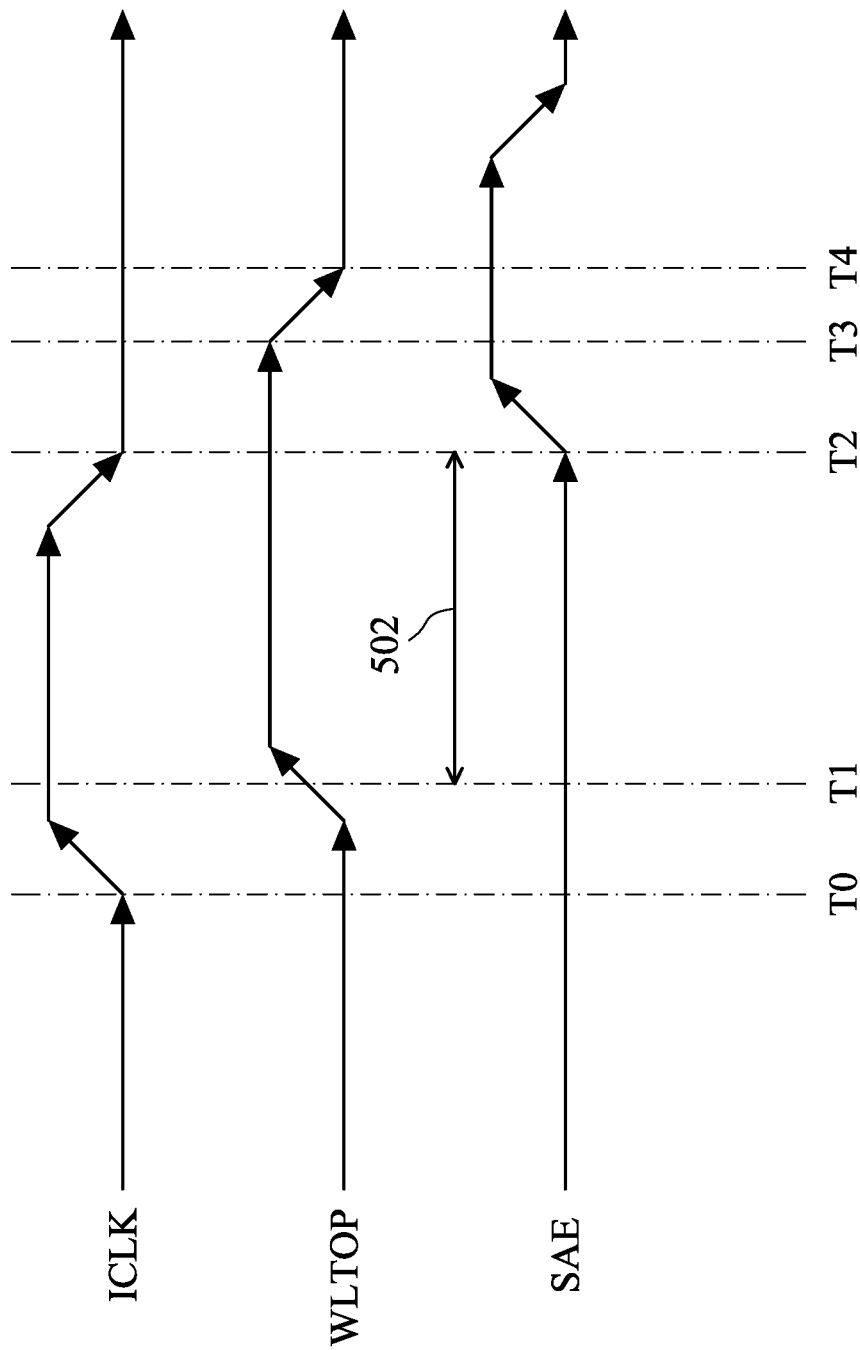
FIGS. 5A, 5B, and 5C are signal waveform diagrams depicting a relationship between voltage and time of signals through a memory device according to embodiments.

FIG. 5A is a signal waveform diagram depicting a relationship between voltage and time for signals through a memory device during a read operation at a nominal voltage, according to an embodiment. At a time T0, an internal clock signal ICLK may be generated. Generation of the internal clock signal may initiate the read operation. Signals that perform the read operation may propagate across word lines to perform the operation on memory cells of a memory bank. In FIG. 5A. WLTOP represents a signal across a particular word line. As a WLTOP pulse begins, the signal begins to discharge bit lines of memory cells in the memory device at a time T1. The bit line discharge time of the weakest memory cell is noted as time gap 502. The pulse width of ICLK is set such that the ICLK pulse ends at a time T2 corresponding with a time when the weakest memory cell is discharged.

As ICLK falls, a sense amplifier enable signal SAE is triggered at time T2. The SAE signal enables a sense amplifier of the circuit allowing it perform functions for a read operation. At a time T3, the WLTOP pulse begins to fall and this signal returns to its original state at time T4. The width of the word line pulse WLTOP may be equal to the bit line discharge of the weakest memory cell plus the rise time of SAE and fall time of WLTOP.

In an embodiment, the loop length of the lines carrying nominal tracking reading signal TWL_RD may be set based on the signal timing of the circuit under the nominal voltage. When the circuit is operated in turbo mode, bit line discharge of the weakest memory cell occurs faster, and the ICLK pulse width may be larger than the weakest memory cell requirement. By including TWL_RD_TURBO, the pulse width may be controlled such that this inefficiency does not occur in read operations.

Figure 5B:
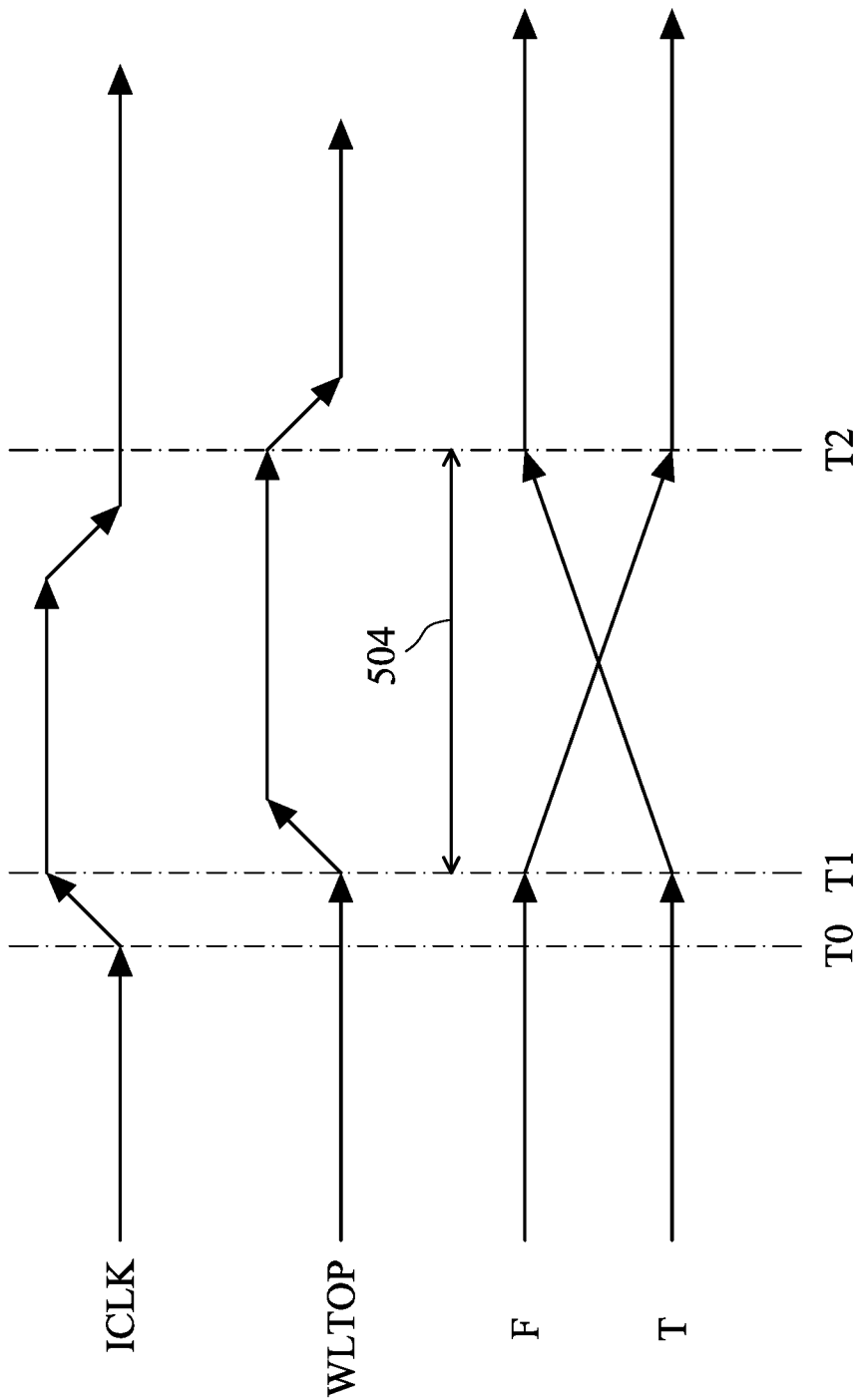

FIG. 5B is a signal waveform diagram depicting a relationship between voltage and time for signals through a memory device during a write operation at a nominal voltage, according to an embodiment. At a time T0, an internal clock signal ICLK may be generated. Generation of the internal clock signal may initiate the write operation. Signals that perform the write operation may propagate across word lines to perform the operation on memory cells of a memory bank. In FIG. 5B. WLTOP represents a signal across a particular word line. As a WLTOP begins, memory cells begin to flip states at a time T1. In an embodiment, F and T lines may represent the voltage across internal nodes of a memory cell of the memory device. The write operation may cause these nodes to flip states.

The flip time of the weakest memory cell of the memory device is noted as time gap 504. To ensure the write operation occurs properly, a width of the word line pulse may be equal to the flip time of the weakest memory cell. The pulse width of ICLK may be set to generate a WLTOP pulse of the appropriate width. At a time T2, the weakest memory cell has flipped, and WLTOP begins to fall.

In an embodiment, the loop length of the lines carrying nominal tracking writing signal TWL_WR may be set based on the signal timing of the circuit under the nominal voltage. When the circuit is operated in turbo mode, flipping of states in the weakest memory cell occurs faster, and the ICLK pulse width may be larger than the weakest memory cell requirement. By including TWL_WR_TURBO, the pulse width may be controlled such that this inefficiency does not occur in write operations.

Figure 5C:
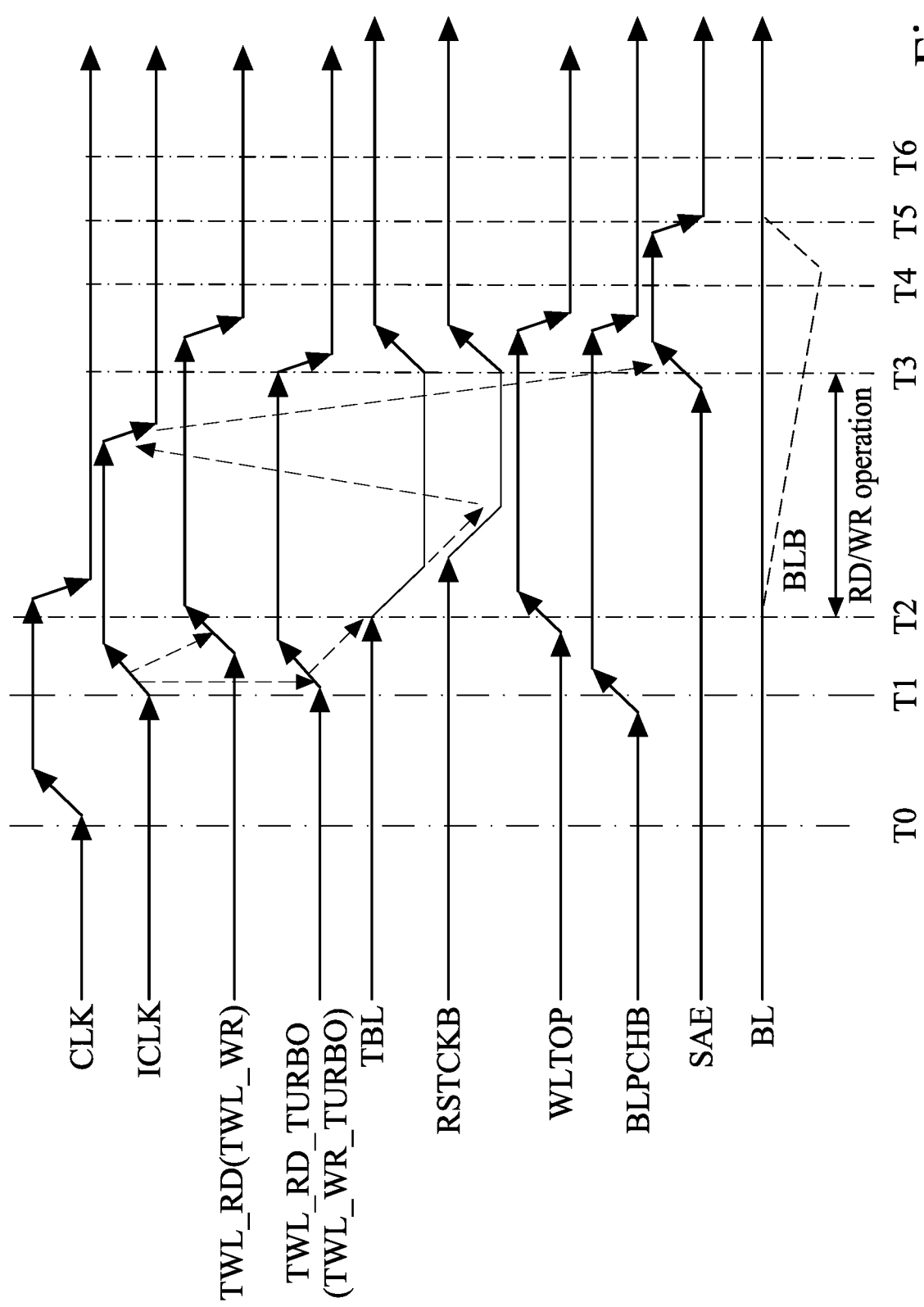

FIG. 5C is a signal waveform diagram depicting a relationship between voltage and time of signals through a memory device operating in turbo mode according to an embodiment. An operation may begin, at time T0, with a pulse of an external clock signal CLK. The external clock signal may be used to generate an internal clock signal ICLK. The internal clock signal ICLK may be generated by a clock generator as described above with respect to FIG. 4. The pulse of ICLK may begin at time T1, and this pulse may initiate a read or write operation for a memory. At a time slightly before T1, a bit line pre-charge signal BLPCHB may be initiated to by the bit line pre-charge signal generator as described above with respect to FIG. 4.

Initiation of the ICLK pulse also triggers the generation of tracking signals by the tracking circuitry. As shown in FIG. 5A, FIG. 5B and FIG. 5C, the turbo tracking signals TWL_RD_TURBO and TWL_WR_TURBO respond and rise quicker than nominal tracking signals TWL_RD and TWL_WR. In a read or write operation, a word line pulse WLTOP is initiated along a word line. The memory is configured such that this pulse occurs concurrently with the nominal tracking signal pulse. At a time T2, the nominal tracking signal reaches a max value and a read or write operation begins. Also at this time, a voltage of a bit line bar (BLB) may dip below a pre-determined voltage of the bit line (BL).

At T2, the tracking signals begin to discharge bit lines of the memory cells, thereby initiating a tracking bit line signal TBL. As described above. TBL signals may be routed through the tracking word line circuit to generate a feedback signal RSTCKB. A pulse of the RSTCKB causes ICLK to go low. In a read cycle, the falling edge of the ICLK signal, in turn, leads to a pulse of the sense amplifier enabling signal SAE which occurs just before a time T3. By including TWL_RD_TURBO and TWL_WR_TURBO, the pulse width of ICLK may be reduced in turbo mode independently for read and write.

At T3, the initiated read or write operation on memory cells concludes, and a turbo signal pulse and a TBL pulse begin to fall back to their off-state values. In a read cycle, SAE peaks at this time allowing the sense amplifier to perform functions related to the read operation. After time T3, all signals other than SAE begin to fall back to their off state. At a time T4, bit line pre-charge pulse BLPCHB is back at its off state. At a time T5, SAE and BLB return to off state values. Finally, at a time T6, all pulses through the circuit have concluded, and the memory device is ready for its next cycle.

Figure 6:
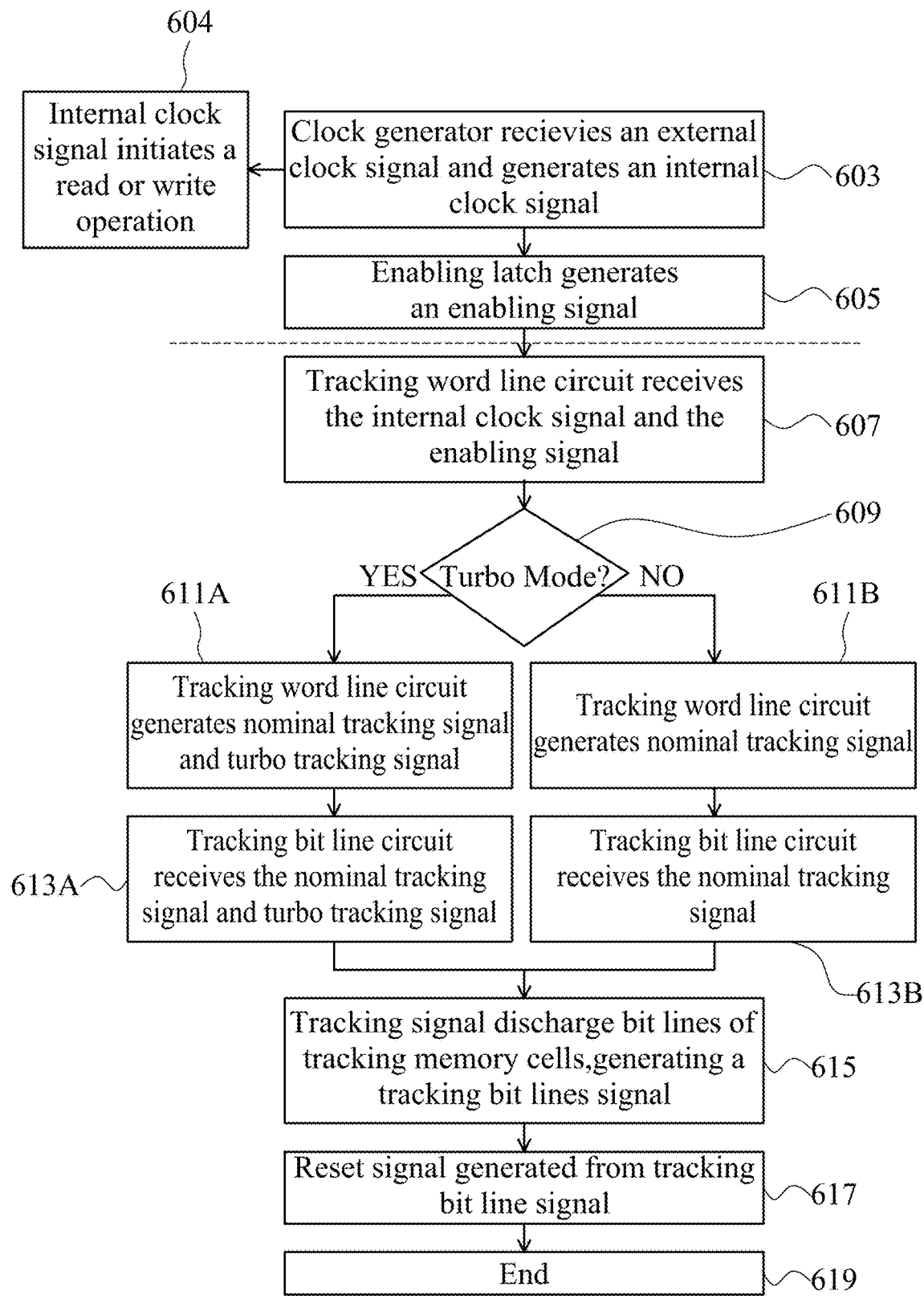
FIG. 6 is a flowchart depicting a method of operating a circuit according to an embodiment.

FIG. 6 is a flowchart depicting a method of operating a circuit according to an embodiment. The method may begin with a clock generator receiving an external clock signal CLK and generating an internal clock signal ICLK at 603. The internal clock signal may be transmitted to a tracking word line circuit to initiate a tracking operation. At the same time, the internal clock signal may be transmitted to drivers and control circuitry of the memory to initiate a read or write operation at 604. The read or write operation may have an operation cycle time and the tracking operation may have a tracking cycle time. The tracking circuitry may be designed such that the tracking cycle time is equal to the operation cycle time. By controlling the loop lengths of the tracking word lines, tracking circuitry described herein may provide a tracking cycle time equivalent to the initiated operation for read and write operations in nominal voltage mode and in turbo mode.

At 605, an enabling latch may generate an enabling signal. The enabling signal may be a read enable signal LWEB or a write enable signal LWE as described above. The enabling signal may also be transmitted to the tracking word line circuit. The dashed line in FIG. 6 indicates that, in some embodiments, operations 603 and 605 may occur in elements outside of tracking circuitry of a memory device, while the following operations take place within the tracking circuitry.

At 609, the tracking word line circuit may receive the internal clock signal ICLK and the enabling signal. The tracking word line circuit may also have an input that receives a turbo signal LTURBO. At 607, a determination may be made as to whether the devices is being operated in turbo mode based on the state of LTURBO. If LTURBO is in an on-state, the device is being operated in turbo mode, but if LTURBO is in an off-state the device is being operated at nominal voltage.

If the device is in turbo mode (LTURBO=1), the method proceeds to 611A and the tracking word line circuit generates both nominal tracking signals and turbo tracking signals. If the enabling signal is a read enable signal, the tracking word line circuit will generate tracking reading signals. If the enabling signal is a write enable signal, the tracking word line circuit will generate tracking writing signals.

Each generated signal may travel along a designated path comprising a word line including a word line loop. Turbo tracking signals may travel along a turbo tracking reading word line (for a turbo tracking reading signal) or a turbo tracking writing line (for a turbo tracking writing signal). Nominal tracking signals may travel along their own respective loops. The length of the loops for nominal tracking signals may be larger than those for turbo tracking signals. At 613A, a tracking bit line circuit may receive these signals. The tracking bit line circuit may comprise tracking memory cells.

If the device is not in turbo mode (LTURBO=0), the method proceeds to 611B and the tracking word line circuit generates only a nominal tracking signal. If the enabling signal is a read enable signal, the tracking word line circuit will generate a tracking reading signal. If the enabling signal is a write enable signal, the tracking word line circuit will generate tracking a writing signal. At 613B the tracking signal is received by the tracking bit line circuit, which may comprise tracking memory cells.

At 615, the tracking signals may discharge bit lines of the tracking memory cells and generate a tracking bit line signal. The speed of this discharge operation may be determined based on the signal(s) received. For example, each type of tracking signal may travel along a corresponding tracking word line. Each tracking word line may be connected to a specific number of tracking cells.

This number may be determined by the circuit designer (or by a software tool configured to assist in circuit design) such that the discharge time corresponds to the time the operation takes to perform on actual memory cells of the memory device. In turbo mode, as described above, both a nominal and a turbo tracking signal are generated and received by the tracking bit line circuit. The nominal tracking signal travels along a corresponding tracking word line and is connected to a first number of tracking memory cells. The turbo tracking signal travels along a different corresponding tracking word line and is connected to a second number of tracking memory cells. Accordingly, the turbo mode operation involves a higher number of tracking memory cells than the nominal voltage operation.

The tracking bit line signal generated in 615 may be routed back to circuitry of the tracking word line circuit. The tracking bit line signal may pass through logic elements, buffers, latches or other means of transforming the signal in order to generate a reset signal at 617. Generation of the reset signal may end the method as indicated at 619. The reset signal may be transmitted outside of the tracking circuitry back to the clock generator to begin a next clock cycle.

Figure 7A:
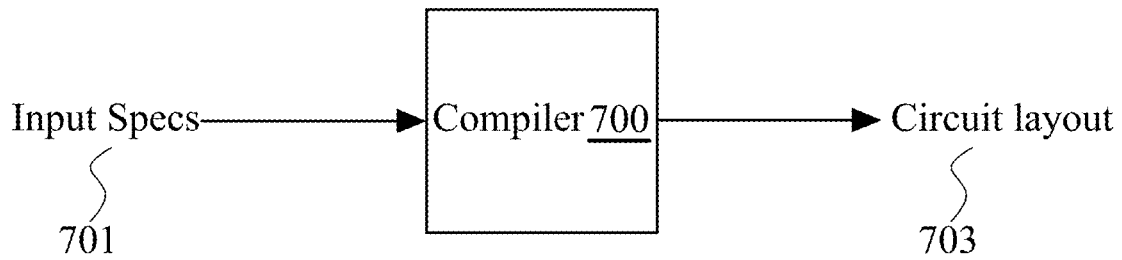
FIGS. 7A and 7B are a block diagram depicting a system for designing a memory device and circuit according to an embodiment and a flowchart depicting a method of designing a memory device and circuit according to an embodiment.

FIG. 7A is a block diagram depicting a system for designing a memory device and circuit according to an embodiment. As described above, the circuits and devices of the present subject matter may be generated by a compiler 700. The compiler may be configured to take particular input specifications 701 as an input and to output a corresponding circuit layout 703.

In an embodiment, the compiler is an SRAM compiler, configured specifically to design SRAM macros and SRAM memory devices. The compiler may be programmed to optimize the loop lengths of the tracking word lines and the number of tracking memory cells connected to each tracking word line.

For example, the loop length of the turbo tracking word lines may be set to optimize the ICLK pulse length for devices operating in turbo mode. The length of the turbo tracking reading word line may be optimized such that the time of the ICLK pulse in a turbo mode reading operation matches the bit line discharge time of the weakest memory cell in turbo mode. The length of the turbo tracking writing line may be optimized such that the time of the ICLK pulse in a turbo writing operation matches the flip time of the weakest memory cell in turbo mode. By providing separate word lines for both read and write operations in turbo mode, the compiler may fine tune the timing for each operation independently.

Figure 7B:
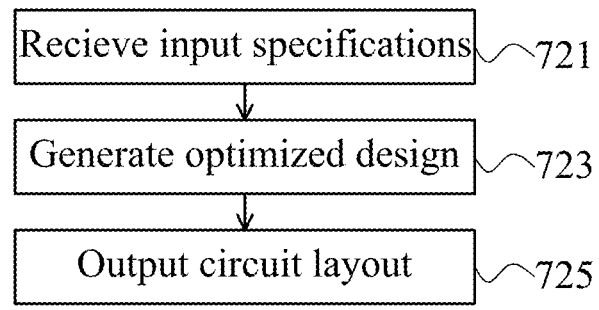

FIG. 7B is a flowchart depicting a method of designing a memory device and circuit according to an embodiment. At 721, a compiler may receive input specifications from a user. In an embodiment, these specifications may include information about a desired SRAM device. At 723, the compiler may generate an optimized design. In this step, the compiler may apply one or more algorithms to determine an optimal layout for a circuit based on the input specifications. For example, the compiler may determine particular tracking word line loops that will introduce a delay in tracking circuitry that matches the delay in a corresponding memory operation. This will improve timing for self-timed SRAM devices. At 725, the compiler will output the optimized circuit layout. This layout may be output to additional software or design tools in order to generate integrated circuits and devices.

Figure 8A:
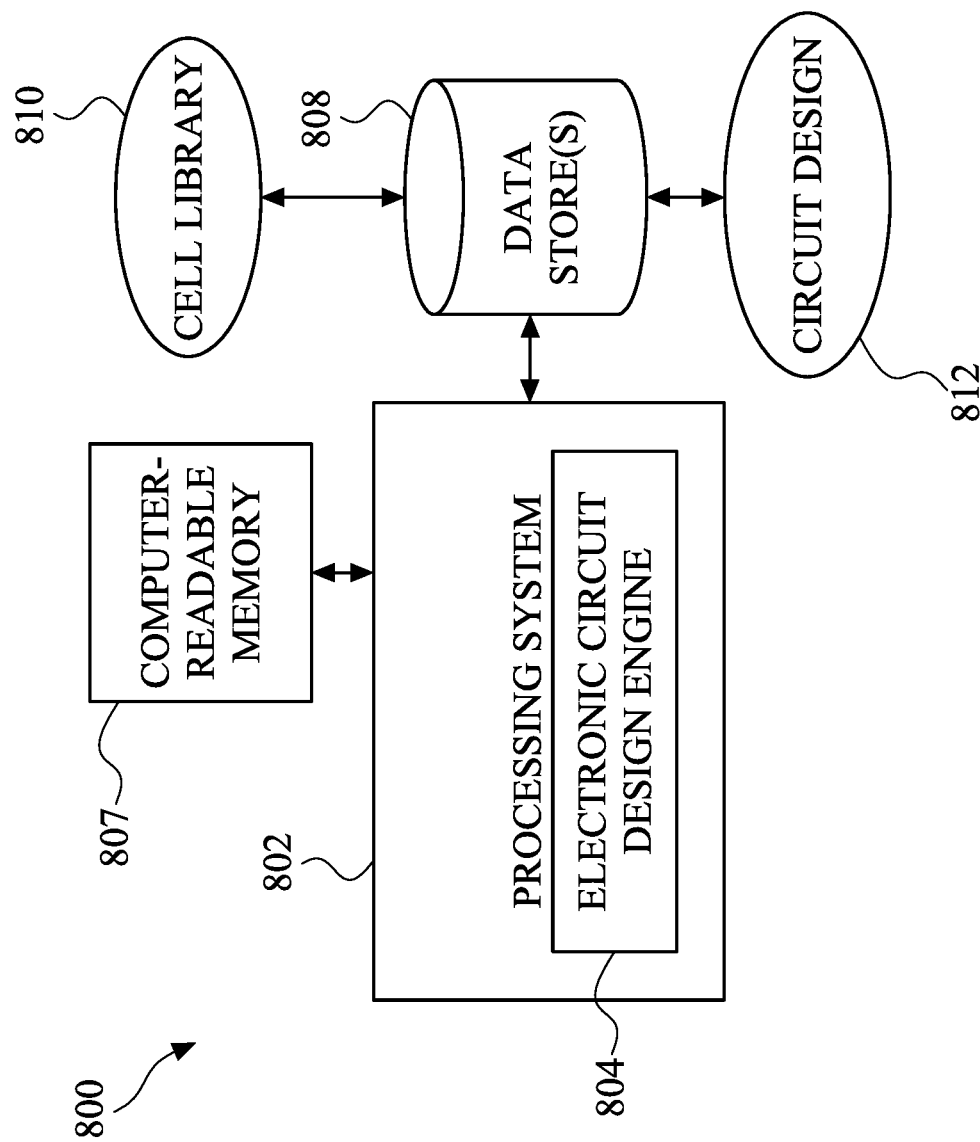
FIGS. 8A, 8B, and 8C are block diagrams depicting example systems for implementing approaches described herein for designing circuits and devices.
Figure 8B:
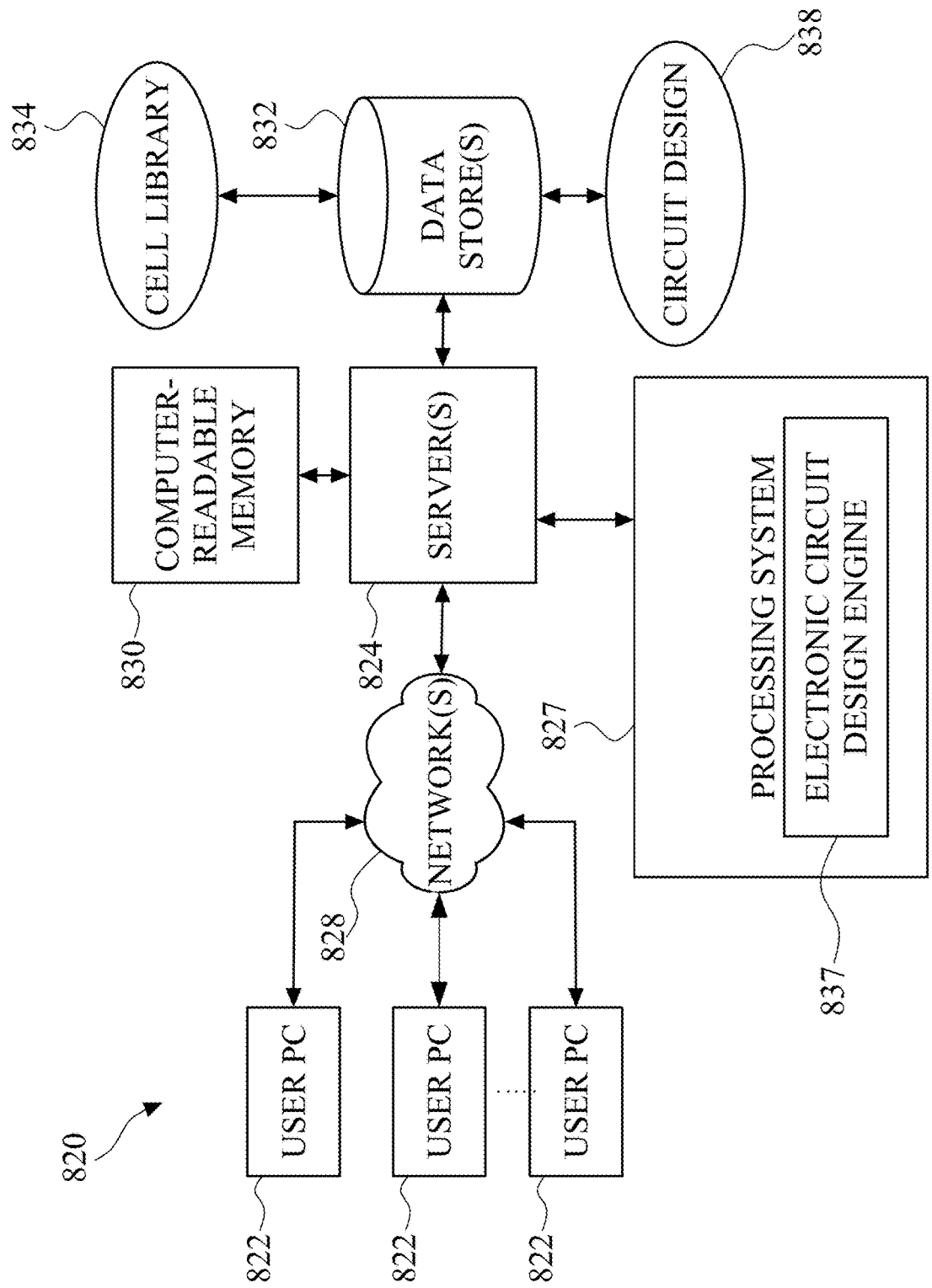
Figure 8C:
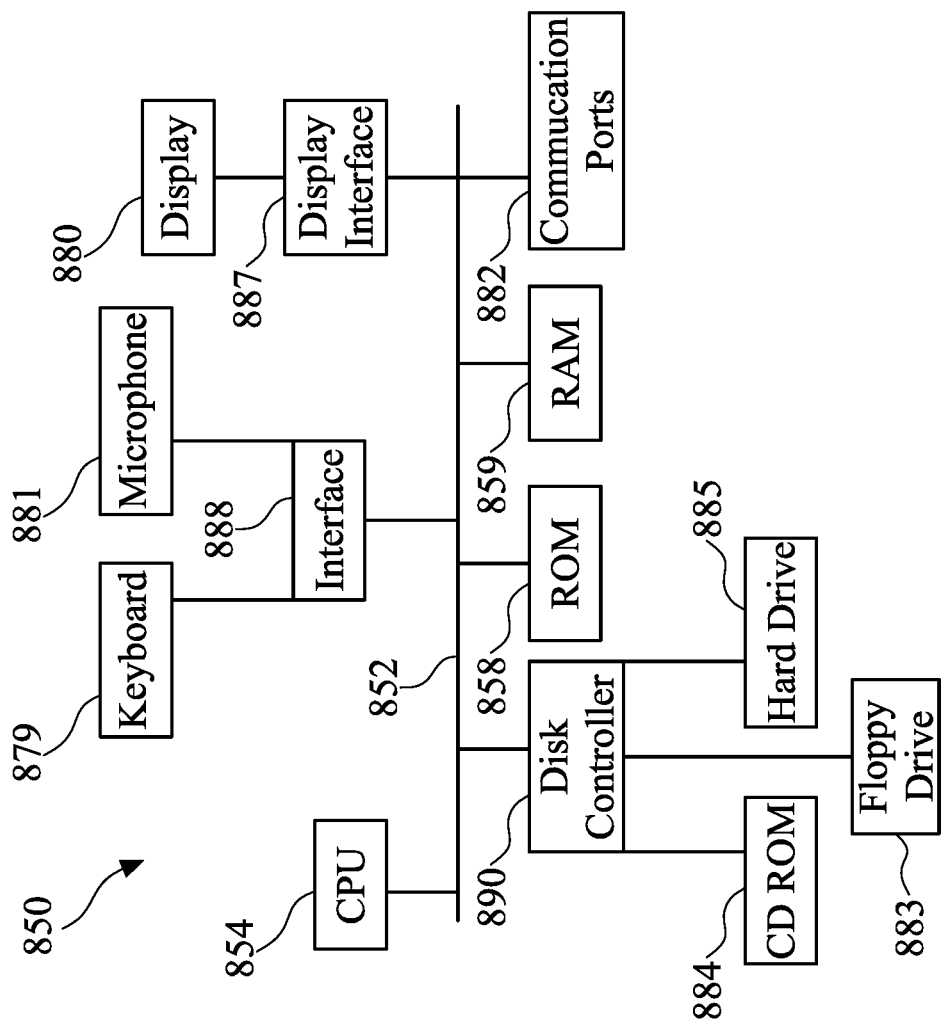

FIGS. 8A, 8B, and 8C depict example systems for implementing the approaches described herein for designing memory circuits and devices. For example, FIG. 8A depicts an exemplary system 800 that includes a standalone computer architecture where a processing system 802 (e.g., one or more computer processors located in a given computer or in multiple computers that may be separate and distinct from one another) includes a computer-implemented electronic circuit design engine 804 being executed on the processing system 802. The processing system 802 has access to a computer-readable memory 807 in addition to one or more data stores 808. The one or more data stores 808 may include a cell library database 810 as well as a circuit design database 812. The processing system 802 may be a distributed parallel computing environment, which may be used to handle very large-scale data sets.

FIG. 8B depicts a system 820 that includes a client-server architecture. One or more user PCs 822 access one or more servers 824 running an electronic circuit design engine 837 on a processing system 827 via one or more networks 828. The one or more servers 824 may access a computer-readable memory 830 as well as one or more data stores 832. The one or more data stores 832 may include a cell library database 834 as well as a circuit design database 838.

FIG. 8C shows a block diagram of exemplary hardware for a standalone computer architecture 850, such as the architecture depicted in FIG. 8A that may be used to include and/or implement the program instructions of system embodiments of the present disclosure. A bus 852 may serve as the information highway interconnecting the other illustrated components of the hardware. A processing system 854 labeled CPU (central processing unit) (e.g., one or more computer processors at a given computer or at multiple computers), may perform calculations and logic operations required to execute a program. A non-transitory processor-readable storage medium, such as read only memory (ROM) 858 and random-access memory (RAM) 859, may be in communication with the processing system 854 and may include one or more programming instructions for performing the method of designing an integrated circuit. Optionally, program instructions may be stored on a non-transitory computer-readable storage medium such as a magnetic disk, optical disk, recordable memory device, flash memory, or other physical storage medium.

In FIGS. 8A, 8B, and 8C, computer readable memories 807, 830, 858, 859 or data stores 808, 832, 883, 884, 888 may include one or more data structures for storing and associating various data used in the example systems for designing an integrated circuit. For example, a data structure stored in any of the aforementioned locations may be used to store data from XML files, initial parameters, and/or data for other variables described herein. A disk controller 890 interfaces one or more optional disk drives to the system bus 852. These disk drives may be external or internal floppy disk drives 883, external or internal CD-ROM, CD-R, CD-RW, or DVD drives 884, or external or internal hard drives 885. In addition to physical drives, the system bus 852 may be in communication with cloud-based virtual drives. As indicated previously, these various disk drives and disk controllers are optional devices.

Each of the element managers, real-time data buffer, conveyors, file input processor, database index shared access memory loader, reference data buffer and data managers may include a software application stored in one or more of the disk drives connected to the disk controller 890, the ROM 858 and/or the RAM 859. The processing system 854 may access one or more components as required. A display interface 887 may permit information from the bus 852 to be displayed on a display device 880 in audio, graphic, or alphanumeric format. Communication with external devices may optionally occur using various communication ports 882. In addition to these computer-type components, the hardware may also include data input devices, such as a keyboard 879, or other input device 881, such as a microphone, remote control, pointer, mouse and/or joystick.

Additionally, the methods and systems described herein may be implemented on many different types of processing devices by program code comprising program instructions that are executable by the device processing subsystem. The software program instructions may include source code, object code, machine code, or any other stored data that is operable to cause a processing system to perform the methods and operations described herein and may be provided in any suitable language such as C. C++, JAVA, for example, or any other suitable programming language. Other implementations may also be used, however, such as firmware or even appropriately designed hardware configured to carry out the methods and systems described herein.

The systems' and methods' data (e.g., associations, mappings, data input, data output, intermediate data results, final data results, etc.) may be stored and implemented in one or more different types of computer-implemented data stores, such as different types of storage devices and programming constructs (e.g., RAM, ROM, Flash memory, flat files, databases, programming data structures, programming variables, IF-THEN (or similar type) statement constructs, etc.). It is noted that data structures describe formats for use in organizing and storing data in databases, programs, memory, or other computer-readable media for use by a computer program.

The computer components, software modules, functions, data stores and data structures described herein may be connected directly or indirectly to each other in order to allow the flow of data needed for their operations. It is also noted that a module or processor includes but is not limited to a unit of code that performs a software operation, and can be implemented for example as a subroutine unit of code, or as a software function unit of code, or as an object (as in an object-oriented paradigm), or as an applet, or in a computer script language, or as another type of computer code. The software components and/or functionality may be located on a single computer or distributed across multiple computers depending upon the situation at hand.

Devices, circuits, and methods are described herein. An example circuit comprises a clock generator that is configured to receive an external clock signal and generate an internal clock signal in response. The circuit further comprises a memory array including one or more memory cells, each of the one or more memory cells are configured to receive a word line signal depending on the internal clock signal. A tracking word line circuit is provided that is configured to receive the internal clock signal, a turbo signal, a read enable signal, and a write enable signal, wherein the tracking word line circuit is configured to generate a first tracking reading signal in response to the internal clock signal, the turbo signal and the read enable signal, and a first tracking writing signal in response to the internal clock signal, the turbo signal, and the write enable signal. A tracking bit line circuit is also provided and is configured to receive the first tracking reading signal and the first tracking writing signal. The tracking bit line circuit is further configured to generate a tracking bit line signal in response to the first tracking reading signal and the first tracking writing signal. The tracking word line circuit is configured to generate a feedback signal in response to the tracking bit line signal and transmit the feedback signal to the clock generator.

An example device comprises plurality of memory banks, each memory bank of the plurality of memory banks comprising a plurality of memory cells, a plurality word lines connected to the plurality of memory cells, a plurality of word line drivers configured to deliver signals to the plurality of memory cells via the plurality of word lines, a global control (GCTRL) region comprising control circuitry configured to control the plurality of word line drivers, a global input/output (GIO) region adjacent to the GCTRL region, and a tracking word line circuit. The tracking word line circuit comprises a plurality of logic elements located in the GCTRL region, a first tracking word line loop extending into the GIO region, and a second tracking word line loop extending into the GIO region. The first tracking word line loop extends further into the GIO region than the second tracking word line loop.

In an example method, a read or write operation having an operation cycle time is performed a tracking operation having a tracking cycle time is performed. The tracking operation comprises receiving an internal clock signal and an enabling signal in a tracking word line circuit, determining whether the device is in turbo mode, and generating at least one tracking signal. The at least one tracking signal comprises a nominal voltage tracking signal when the device is not in turbo mode, and comprises both a nominal voltage tracking signal and a turbo tracking signal when the device is in turbo mode. The method further comprises receiving the at least one tracking signal in a tracking bit line circuit, wherein the tracking bit line circuit comprises a plurality of tracking memory cells, generating a tracking bit line signal from the at least one tracking signal, and generating a reset signal from the tracking bit line signal. In the example method, the operation cycle time is equal to the tracking cycle time.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the scope of the present disclosure.

What is claimed is:

1. A circuit, comprising:
   a clock generator configured to generate an internal clock signal in response to a received external clock signal;
   a memory array including one or more memory cells, each of the one or more memory cells configured to receive a word line signal in response to the internal clock signal;
   a tracking word line circuit configured to receive the internal clock signal, a turbo signal, a read enable signal, and a write enable signal, wherein the tracking word line circuit is configured to generate a first tracking reading signal in response to the internal clock signal, the turbo signal and the read enable signal, and a first tracking writing signal in response to the internal clock signal, the turbo signal, and the write enable signal;
   a tracking bit line circuit configured to receive the first tracking reading signal and the first tracking writing signal, wherein the tracking bit line circuit is configured to generate a tracking bit line signal in response to the first tracking reading signal and the first tracking writing signal,
   wherein the tracking word line circuit is configured to generate a reset signal in response to the tracking bit line signal and transmit the reset signal to the clock generator.

2. The circuit of claim 1, wherein the tracking word line circuit comprises a first logic element configured to output the first tracking reading signal when the internal clock signal, the turbo signal, and the read enable signal are in an on-state; and
   a second logic element configured to output the first tracking writing signal when the internal clock signal, the turbo signal, and the write enable signal are in an on-state.

3. The circuit of claim 1, wherein the tracking bit line circuit comprises a plurality of tracking memory cells; and
   the tracking memory cells are configured to receive the first tracking reading signal and the first tracking writing signal as an input and to generate the tracking bit line signal as an output.

4. The circuit of claim 1, wherein the tracking word line circuit is further configured to generate a second tracking reading signal in response to the internal clock signal and the read enable signal, and a second tracking writing signal in response to the internal clock signal and the write enable signal.

5. The circuit of claim 4, further comprising a first tracking word line loop configured to transmit the first tracking reading signal and a second tracking word line loop configured to transmit the second tracking reading signal,
   wherein a length of the second tracking word line loop is greater than a length of the first tracking word line loop.

6. The circuit of claim 5, further comprising a third tracking word line loop configured to transmit the first tracking writing signal and a fourth tracking word line loop configured to transmit the second tracking writing signal,
   wherein a length of the fourth tracking word line loop is greater than a length of the third tracking word line loop.

7. The circuit of claim 4, further comprising a plurality of logic gates configured to generate the first tracking reading signal, the first tracking writing signal, the second tracking reading signal, and the second tracking writing signal.

8. The circuit of claim 7, wherein the plurality of logic gates comprises:
   a first AND gate configured to receive the internal clock signal and the read enable signal, and output the second tracking reading signal;
   a second AND gate configured to receive the internal clock signal and the write enable signal, and output the second tracking writing signal;
   a third AND gate configured to receive the internal clock signal, the write enable signal, and the turbo signal, and output the first tracking writing signal; and
   a fourth AND gate configured to receive the internal clock signal, the read enable signal, and the turbo signal, and output the first tracking reading signal.

9. The circuit of claim 1, further comprising a global input/output (GIO) region; and
   a plurality of tracking word lines configured to transmit the first tracking writing signal and the first tracking reading signal,
   wherein the plurality of tracking word lines extend into the GIO region;
   the GIO region has a first extension length; and
   a first tracking word line of the plurality of tracking word lines extends a distance less than the first extension length into the GIO region.

10. The circuit of claim 1, wherein the tracking word line circuit is configured to introduce a first delay to the first tracking writing signal and a second delay to the first tracking reading signal; and the clock generator is configured to generate the internal clock signal such that a pulse width of the internal clock signal is a function of the first delay or the second delay.

11. A semiconductor device, comprising:
a plurality of memory banks, each memory bank of the plurality of memory banks comprising a plurality of memory cells;
a plurality word lines connected to the plurality of memory cells;
a plurality of word line drivers configured to deliver signals to the plurality of memory cells via the plurality of word lines;
a global control (GCTRL) region comprising control circuitry configured to control the plurality of word line drivers;
a global input/out (GIO) region adjacent to the GCTRL region; and
a tracking word line circuit comprising:
a plurality of logic elements located in the GCTRL region;
a first tracking word line loop extending into the GIO region; and
a second tracking word line loop extending into the GIO region,
wherein the first tracking word line loop extends further into the GIO region than the second tracking word line loop.

12. The device of claim 11, the tracking word line circuit further comprising a third tracking word line loop and a fourth tracking word line loop,
wherein the third tracking word line loop extends further into the GIO region than the fourth tracking word line loop.

13. The device of claim 12, wherein the first tracking word line loop and the third tracking word line loop have a same extension into the GIO region.

14. The device of claim 11, further comprising a tracking bit line circuit connected to the tracking word line circuit.

15. The device of claim 14, wherein the tracking bit line circuit comprises a plurality of tracking memory cells;
a first tracking memory cell of the plurality of tracking memory cells is connected to the first tracking word line loop; and
a second tracking memory cell of the plurality of tracking memory cells is connected to the second tracking word line loop.

16. The device of claim 11, further comprising a clock generation circuit in the GCTRL region configured to generate an internal clock signal,
wherein the word line drivers are configured to receive the internal clock signal as an input, and the tracking word line circuit is configured to receive the internal clock signal as an input.

17. The device of claim 11, further comprising a third tracking word line loop and a fourth tracking word line loop,
wherein the first tracking word line loop is configured to carry a nominal voltage tracking reading signal;
the second tracking word line loop is configured to carry a turbo mode tracking reading signal;
the third tracking word line loop is configured to carry a nominal voltage tracking writing signal; and
the fourth tracking word line loop is configured to carry a turbo mode tracking writing signal.

18. A method comprising:
performing a read or write operation having an operation cycle time; and
performing a tracking operation having a tracking cycle time,
wherein the tracking operation comprises:
receiving an internal clock signal and an enabling signal in a tracking word line circuit;
determining whether a device is in turbo mode;
generating at least one tracking signal, wherein the at least one tracking signal comprises a nominal voltage tracking signal when the device is not in turbo mode, and comprises both the nominal voltage tracking signal and a turbo tracking signal when the device is in turbo mode;
receiving the at least one tracking signal in a tracking bit line circuit, wherein the tracking bit line circuit comprises a plurality of tracking memory cells;
generating a tracking bit line signal from the at least one tracking signal; and
generating a reset signal from the tracking bit line signal,
wherein the operation cycle time is equal to the tracking cycle time.

19. The method of claim 18, wherein the enabling signal is a read enable signal and the at least one tracking signal comprises at least one tracking reading signal.

20. The method of claim 19, wherein the enabling signal a write enable signal and the at least one tracking signal comprises at least one tracking writing signal.

* * * * *